(12) United States Patent
Lau et al.

(10) Patent No.: US 9,287,236 B2
(45) Date of Patent: Mar. 15, 2016

(54) FLEXIBLE PACKAGED INTEGRATED CIRCUIT

(71) Applicants: Teck Beng Lau, Petaling Jaya (MY); Chee Seng Foong, Sungai Buloh (MY); Chin Teck Siong, Shah Alam (MY)

(72) Inventors: Teck Beng Lau, Petaling Jaya (MY); Chee Seng Foong, Sungai Buloh (MY); Chin Teck Siong, Shah Alam (MY)

(73) Assignee: FREESCALE SEMICONDUCTOR, INC., Austin, TX (US)

( * ) Notice: Subject to any disclaimer, the term of this patent is extended or adjusted under 35 U.S.C. 154(b) by 0 days.

(21) Appl. No.: 14/334,655

(22) Filed: Jul. 17, 2014

(65) Prior Publication Data

US 2016/0020189 A1    Jan. 21, 2016

(51) Int. Cl.
*H01L 23/00*    (2006.01)
*H01L 21/56*    (2006.01)

(52) U.S. Cl.
CPC .............. *H01L 24/83* (2013.01); *H01L 21/563* (2013.01); *H01L 2924/15747* (2013.01); *H01L 2924/15763* (2013.01); *H01L 2924/1811* (2013.01)

(58) Field of Classification Search
CPC .................. H01L 24/83; H01L 21/563; H01L 2924/15763; H01L 2924/15747; H01L 2924/1811; H01L 2924/00; H01L 2924/14; H01L 21/561; H01L 21/78; H01L 2924/1461
USPC .......................................... 438/112, 123, 127
See application file for complete search history.

(56) References Cited

U.S. PATENT DOCUMENTS

| 6,049,129 | A  | * | 4/2000  | Yew ........................ H01L 23/24 257/737 |
| 6,177,723 | B1 | * | 1/2001  | Eng ........................ H01L 23/24 257/685 |
| 7,033,863 | B2 |   | 4/2006  | Tokushige |
| 7,112,872 | B2 |   | 9/2006  | Ohara |
| 7,951,691 | B2 |   | 5/2011  | Burghartz |
| 8,389,862 | B2 |   | 3/2013  | Arora et al. |
| 8,704,383 | B2 |   | 4/2014  | Lu |
| 2002/0119603 | A1 | * | 8/2002 | Tani ..................... H01L 23/3107 438/123 |
| 2003/0127423 | A1 | * | 7/2003 | Dlugokecki .......... H01L 21/485 216/14 |
| 2011/0297831 | A1 | * | 12/2011 | Yao ........................ G01S 7/4813 250/338.4 |
| 2013/0241077 | A1 | * | 9/2013 | Fuergut ................. H01L 23/492 257/774 |
| 2014/0035129 | A1 |   | 2/2014  | Stuber et al. |
| 2014/0284080 | A1 | * | 9/2014 | Zhang .................. H05K 3/1233 174/250 |

OTHER PUBLICATIONS

Parton, Els, Wim Christiaens, and Jan Vanfleteren. "Embedded Chips Redefine Miniaturization." Printed Circuit Design & Fab 26.7, Jul. 1, 2009, pp. 37-39.

* cited by examiner

*Primary Examiner* — Caleen Sullivan
(74) *Attorney, Agent, or Firm* — Charles E. Bergere

(57) ABSTRACT

A method for assembling a thin, flexible integrated circuit (IC) device includes using an etched contoured lead frame having raised features. A die is attached to the lead frame to form a sub-assembly that is then selectively coated with a low-modulus gel. The sub-assembly is covered with a temporary mask for sputter deposition of a metallic seed layer for interconnects between the die and the raised features. The mask is removed and more robust metal interconnects are grown over the seed paths using electroplating. The sub-assembly top is then coated with another gel layer. The bottom of the sub-assembly and of the contoured lead frame is removed, which transforms the raised features into leads. The newly exposed bottom of the sub-assembly is covered with a third layer of gel to complete assembly of the packaged device.

18 Claims, 5 Drawing Sheets

100

100

100

200

200

200

200

200

200

200

200

200

200

200

200

FIG. 8A
800
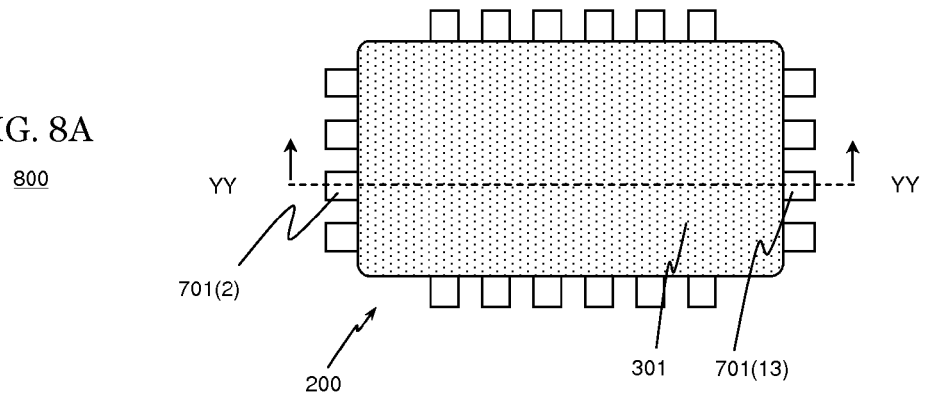
FIG. 8B
800
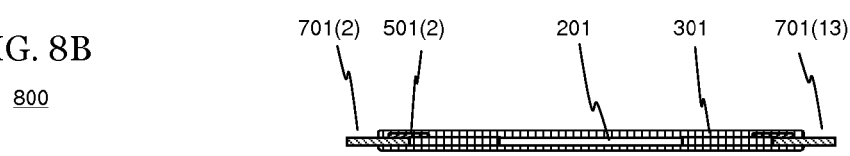
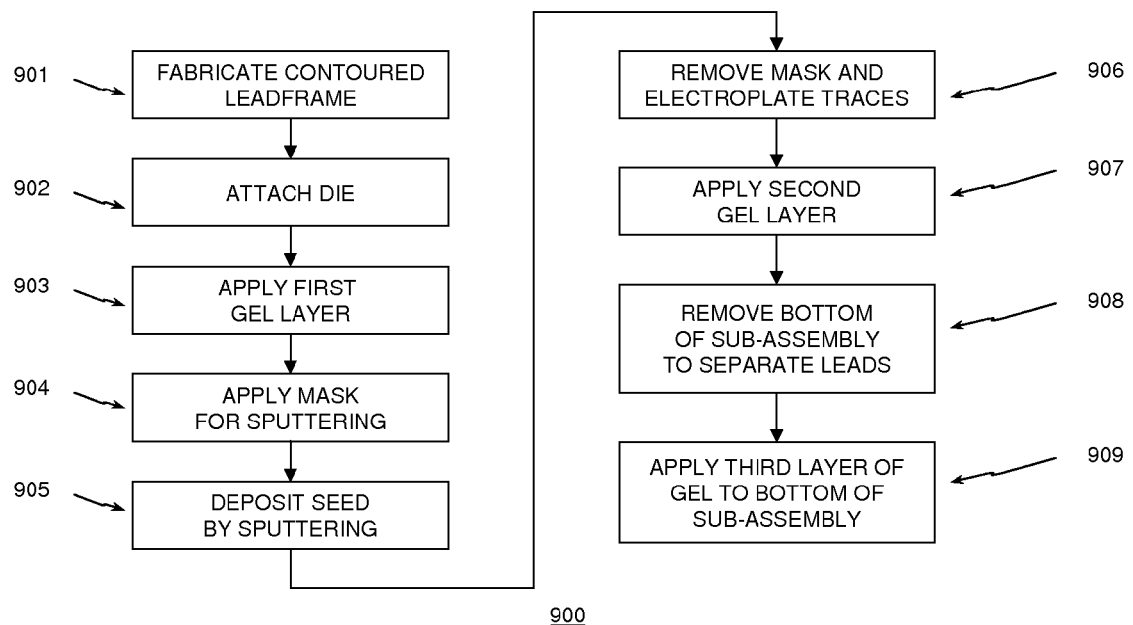
FIG. 9

FLEXIBLE PACKAGED INTEGRATED CIRCUIT

BACKGROUND OF THE INVENTION

The present invention relates to integrated circuit (IC) packaging and, more particularly, to assembling a flexible integrated circuit device.

Typical integrated circuit chips comprise rigid dies, together with at least a portion of a lead frame or a substrate, encapsulated in a rigid encapsulant. These typical chips are well suited for conventional applications, such as mounting on substantially rigid printed circuit boards.

Subsequent developments in manufacturing and assembly technologies have enabled the manufacture of relatively thin and flexible IC chips. Ultra-thin-chip package (UTCP) technology is one technology used for manufacturing flexible IC chips. The UTCP process involves attaching a thin IC die to a thin polyimide substrate, then adding a second thin polyimide layer atop the thin die and substrate. This is then followed by the drilling of wells through the second polyimide layer down to the die's bond pads for forming vias, and then metalizing the vias along with conductive paths and chip contacts.

UTCP technology is relatively expensive for mass-market commercial use as it may require specialized equipment and processing. Accordingly, it would be advantageous to have another way to assemble a flexible IC chip.

BRIEF DESCRIPTION OF THE DRAWINGS

Other aspects, features, and advantages of the invention will become more fully apparent from the following detailed description, the appended claims, and the accompanying drawings in which like reference numerals identify similar or identical elements. Note that elements in the figures are not drawn to scale.

FIG. 8A is a plan view of a chip, assembled by the application of the third layer of gel to the sub-assembly of FIG. 7A;

FIG. 8B is a cross-sectional side view of the chip of FIG. 8A; and

FIG. 9 is a flow chart of an assembly process in accordance with an embodiment of the present invention.

DETAILED DESCRIPTION

Figure 1A:
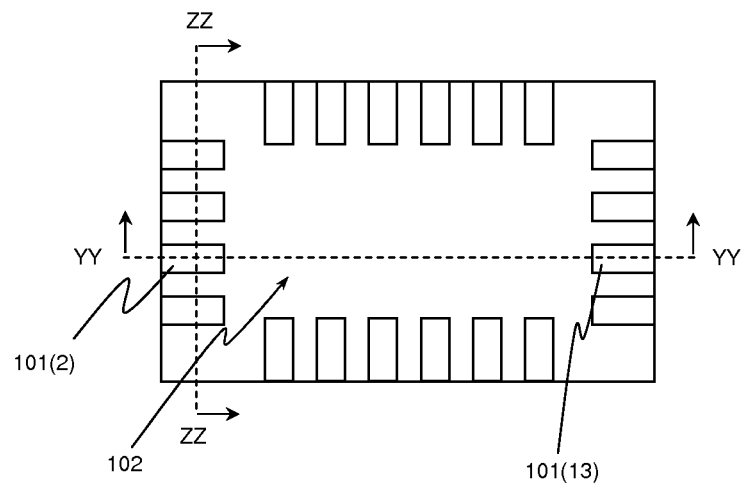
FIG. 1A is a plan view of a contoured lead frame, in accordance with one embodiment of the present invention.

Detailed illustrative embodiments of the present invention are disclosed herein. However, specific structural and functional details disclosed herein are merely representative for purposes of describing example embodiments of the present invention. Embodiments of the present invention may be embodied in many alternative forms and should not be construed as limited to only the embodiments set forth herein. Further, the terminology used herein is for the purpose of describing particular embodiments only and is not intended to be limiting of example embodiments of the invention.

As used herein, the singular forms "a," "an," and "the," are intended to include the plural forms as well, unless the context clearly indicates otherwise. It further will be understood that the terms "comprises," "comprising," "has," "having," "includes," and/or "including" specify the presence of stated features, steps, or components, but do not preclude the presence or addition of one or more other features, steps, or components. It also should be noted that, in some alternative implementations, the functions/acts noted may occur out of the order noted in the figures.

In one embodiment, the present invention provides a method of assembling a thin, flexible IC device. The method includes mounting an IC die on a contoured lead frame to form a sub-assembly. The lead frame resembles a flat rectangular roof with a low and thick crenellated parapet around its sides. The contoured lead frame comprises a planar base plate having (i) a medial region that includes a die-pad area and (ii) an edge area that supports raised features—corresponding to merlons of a crenellated parapet—that will form the leads of the chip. In other words, the raised features are rectangular features separated by rectangular gaps. These raised features may be considered to be proto-leads.

The sub-assembly top is coated with a low-modulus gel (first encapsulant), leaving exposed (i) at least portions of the tops of the raised features and (ii) the bond pads of the die. Low-modulus gel refers to an encapsulant that (i) before curing, is gel-like and (ii) after curing, forms a cohesive and flexible structure. In one embodiment, the low-modulus gel has a tensile modulus, after curing, of less than 100 MPa. Using a mask, a metallic seed layer is deposited using sputtering of a first metal to seed metal interconnects between the die's bond pads and the raised features. Then the metallic interconnects are formed along the seeded paths using electroplating with a second metal.

The top of the sub-assembly, including the metal interconnects, is then again coated with gel (second encapsulant). Afterwards, the bottom of the sub-assembly, including the entirety of the lead frame base plate, is ground away and a gel coating (third encapsulant) is applied to the bottom of the sub-assembly to form a flexible chip comprising the die, leads, and interconnects encapsulated in cured low-modulus gel. The chip is then ready for application in a location where it may be flexed, such as, for example, on a curved surface or a fabric.

FIGS. 1A-8B illustrate steps in the assembly of an IC chip 800 in accordance with one embodiment of the present invention.

Referring now to FIG. 1A, a plan view of a contoured lead frame 100 in accordance with one embodiment of the present invention is shown. Contoured lead frame 100 is in the form of a rectangular plane with raised features 101 along the edges of the lead frame 100, including exemplary raised features 101(2) and 101(13). Note that, in this implementation, the raised features are numbered sequentially clockwise from the bottom left corner. Other implementations may use different numbering schemes. The edges of lead frame 100 resemble a crenellated parapet, where the raised features 101 form the merlons. The raised features 101 are substantially box-like—in other words, each raised feature is substantially a rectangular prism whose axis substantially parallels the base plate. The central area of lead frame 100 is flat and includes die-pad area 102.

Figure 1B:
FIG. 1B is a side cross-sectional view of the contoured lead frame of FIG. 1A.

FIG. 1B shows a side cross-sectional view of the contoured lead frame 100 of FIG. 1A viewed along cut line YY-YY, which goes through exemplary raised features 101(2) and 101(13) and flat die-pad area 102. In one implementation, the thickness of lead frame 100 through (a) the raised features 101 is 90-270 μm and (b) the die pad 102 is 40-60 μm. A die-pad thickness of approximately 50 μm provides sufficient structural support for the processing steps while using a minimal volume of metal that will be later removed, as described below.

Figure 1C:
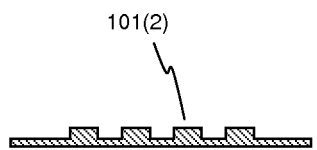
FIG. 1C is a different side cross-sectional view of the contoured lead frame of FIG. 1A.

FIG. 1C shows a side cross-sectional view of the contoured lead frame 100 of FIG. 1A along cut line ZZ-ZZ, which goes through, among others, exemplary raised feature 101(2). FIG. 1C illustrates the crenellation along the edges of lead frame 100, where the raised features 101 appear as merlons.

Contoured lead frame 100 comprises a metal such as copper. The lead frame 100 may be manufactured by, for example, casting, pressing, stamping, milling, grinding, or etching. In one implementation, a copper sheet is etched to an intermediate depth to form the contoured lead frame 100. Etching a sheet to an intermediate depth is sometimes referred to as half-etching. Consequently, the contoured lead frame 100 may also be referred to as a half-etched lead frame. The etching may be via any applicable means, such as, for example, chemical or physical etching.

Figure 2A:
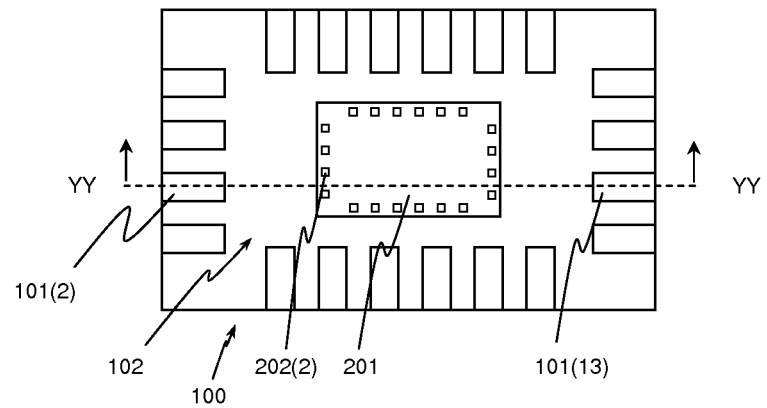
FIG. 2A is a plan view of the sub-assembly following the attachment of a die to the die pad of the contoured lead frame of FIG. 1A.

FIG. 2A shows a plan view of the sub-assembly 200 following the attachment of a die 201 to the die pad 102 of the contoured lead frame 100 of FIG. 1A. Die 201 includes a plurality of contact points 202—such as exemplary bond pad 202(2)—for connection to corresponding raised features 101—such as exemplary raised feature 101(2). Die attach for attaching the die 201 to the die pad 102 is not shown. Any suitable die attach may be used. Note that the die attach will be removed in a later step and, as a result, the long-term characteristics of the die attach are not important. Preferably, the die-attach material is low-cost and easy to remove via, for example, grinding and/or etching.

Figure 2B:
FIG. 2B is a side cross-sectional view of the sub-assembly of FIG. 2A.

FIG. 2B shows a side cross-sectional view of the sub-assembly 200 of FIG. 2A along cut line YY-YY. The height of die 201 may be 40 μm-230 μm, and the top of die 201 is substantially level with the tops of raised features 101. Following die attachment, the top of the sub-assembly 200 is partially coated with an encapsulant that is then cured.

Figure 3A:
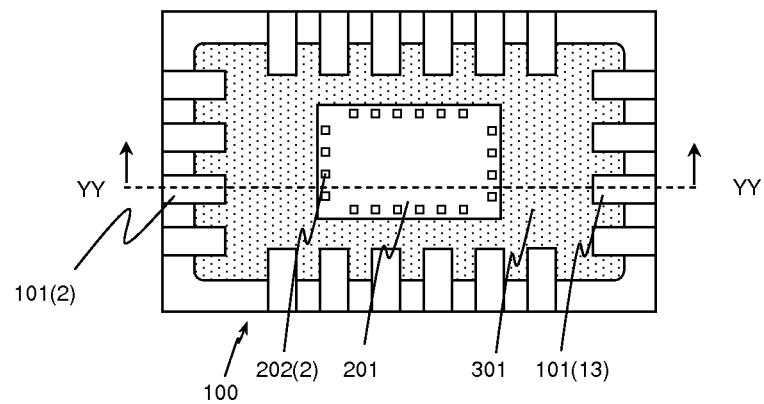
FIG. 3A is a plan view of the sub-assembly of FIG. 2A after the application and curing of low-modulus gel.

FIG. 3A shows a plan view of the sub-assembly 200 of FIG. 2A after the application and curing of low-modulus gel 301. Gel 301 is applied so as to leave exposed the bond pads 202 of the die 201 and at least portions of the raised features 101. This may be accomplished by, for example, (i) applying the gel through a corresponding mask, such as stencil printing through a metal mask or (ii) applying the gel broadly and then uncovering the bond pads 202 and/or raised features 101 using etching. The borders of the gel 301 extend to a medial portion of the raised features 101 so that when chip assembly is completed, the chip will have leads with encapsulated proximal portions and exposed distal portions.

Figure 3B:
FIG. 3B is a cross-sectional side view of the sub-assembly of FIG. 3A.

FIG. 3B shows a cross-sectional side view of the sub-assembly 200 of FIG. 3A along cut line YY-YY. The top of gel 301 is shown as level with the tops of the die 201 and the raised features 101. Note, however, that the gel 301 may be applied so that its top is somewhat above or below the tops of the die 201 and/or the raised features 101—for example, the height of the gel 301 may be within 25% of the height of the die 201. Following the curing of the gel 301, a mask, such as, for example, a polymer stencil mask, is applied to the top of the sub-assembly 200 in preparation for sputter deposition of an interconnect seed layer.

Figure 4A:
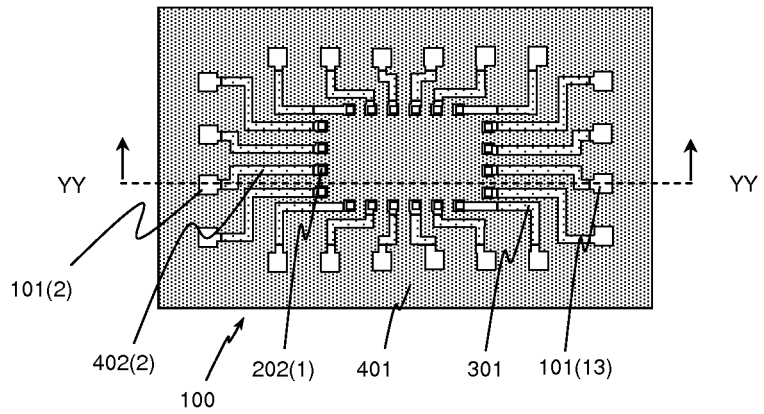
FIG. 4A is a plan view of the sub-assembly of FIG. 3A after the placement of a polymer mask atop the sub-assembly.

FIG. 4A shows a plan view of the sub-assembly 200 of FIG. 3A after the placement of a polymer mask 401 atop the sub-assembly. The mask 401 has openings 402, such as exemplary opening 402(2), which define where interconnects will be made between bond pads 202 and corresponding raised features 101.

Figure 4B:
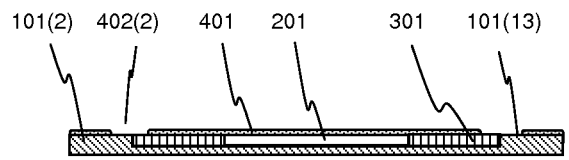
FIG. 4B is a cross-sectional side view of the sub-assembly 200 of FIG. 4A.

FIG. 4B shows a cross-sectional side view of the sub-assembly 200 of FIG. 4A along cut line YY-YY.

After mask 401 of FIGS. 4A and 4B is in place, sputtering is used to deposit a thin seed layer of titanium-tungsten (TiW) alloy on the top of sub-assembly 200 in the areas of openings 402 to generate seed paths. After the seed layer has been deposited, the mask 401 is removed by, for example, chemical etching.

The mask is removed prior to electroplating to prevent contamination of the electrolyte with dissolved mask material. It should be noted, however, that, in alternative embodiments where, for example, the mask would not dissolve in and/or would not contaminate the electrolyte, the mask may stay on during the electroplating process and may be removed later.

Electroplating is used to deposit copper (Cu) over the seed paths corresponding to openings 402, thereby generating copper interconnects corresponding to openings 402. The seeding is used to make practicable the subsequent step of copper electroplating. The combination of seeding and electroplating is used in this embodiment as it allows for the formation of thicker and more robust conductive interconnects than other presently available technologies, such as, for example, photolithography. Note, however, that alternative embodiments might use such or other technologies to form conductive interconnects between the die's contact points 202 and corresponding raised features 101.

Figure 5A:
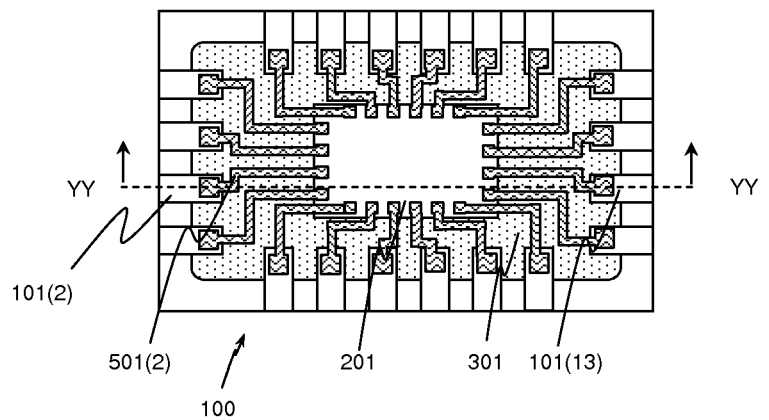
FIG. 5A is a plan view of the sub-assembly of FIG. 4A after the electroplating build-up of copper traces.

FIG. 5A shows a plan view of the sub-assembly 200 of FIG. 4A after the electroplating build-up of copper traces 501—such as exemplary copper trace 501(2) that interconnects bond pad 202(2) and corresponding raised feature 101(2). The copper traces 501 (i) interconnect bond pads 202 to corresponding raised features 101 and (ii) are typically 10-50 μm high.

Figure 5B:
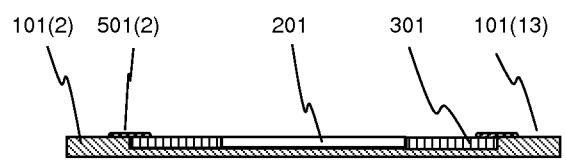
FIG. 5B is a cross-sectional side view of the sub-assembly of FIG. 5A.

FIG. 5B shows a cross-sectional side view of the sub-assembly 200 of FIG. 5A along cut line YY-YY, showing the traces 501 having a height of 10-50 μm. After the electroplating of the interconnects, the top sub-assembly 200 is coated with a second layer of the low-modulus gel 301, which is then cured.

Figure 6A:
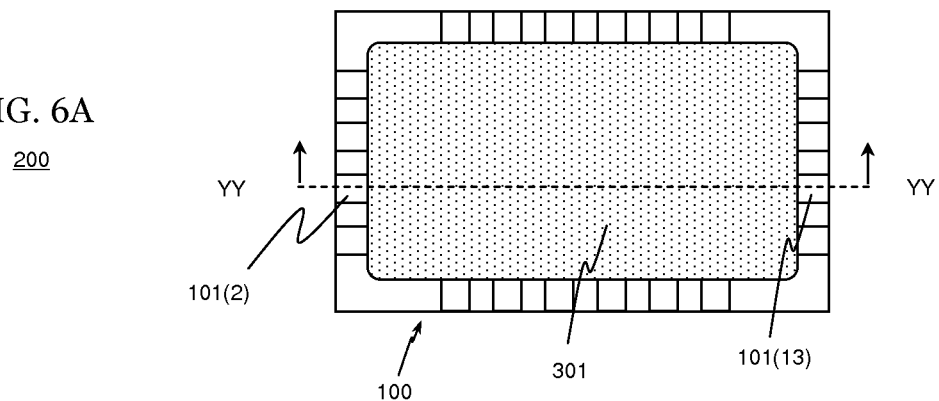
FIG. 6A is a plan view of the sub-assembly of FIG. 5A after the application of the second layer of low-modulus gel.

FIG. 6A shows a plan view of the sub-assembly 200 of FIG. 5A after the application of the second layer of low-modulus gel 301.

Figure 6B:
FIG. 6B is a simplified cross-sectional side view of the sub-assembly of FIG. 6A.

FIG. 6B shows a simplified cross-sectional side view of the sub-assembly 200 of FIG. 6A along cut line YY-YY. After the application of the second layer of encapsulant, the bottom of the sub-assembly 200—including the base plate of the lead frame 100—is removed to separate the raised features 101 from each other.

Figure 7A:
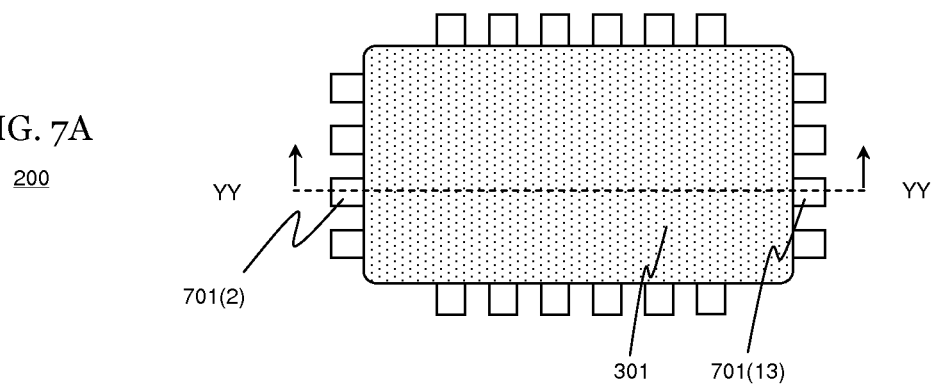
FIG. 7A is a plan view of the sub-assembly of FIG. 6A after the removal of the bottom of the sub-assembly.

FIG. 7A shows a plan view of the sub-assembly 200 of FIG. 6A after the removal of the bottom of the sub-assembly 200. The removal may be accomplished by, for example, chemical etching and/or mechanical grinding. The removal separates and thins the raised features 101 to form corresponding leads 701—such as exemplary leads 701(2) and 701(13). The removal may also thin the die 201 to increase its flexibility.

Figure 7B:
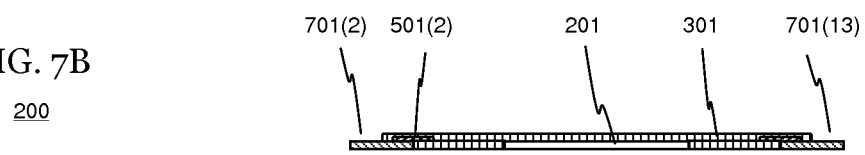
FIG. 7B is a simplified cross-sectional side view of the sub-assembly of FIG. 7A.

FIG. 7B shows a simplified cross-sectional side view of the sub-assembly 200 of FIG. 7A along cut line YY-YY. The base plate 102 of FIG. 1B has been removed, and die 201 has been thinned to increase package flexibility. Following the removal of the bottom of the sub-assembly 200, the newly exposed bottom of the sub-assembly 200 is coated with a third layer of low-modulus gel 301, which is then cured.

FIG. 8A shows a plan view of a chip 800, assembled by the application of the third layer of gel 301 to the sub-assembly 200 of FIG. 7A.

FIG. 8B shows a cross-sectional side view of the chip 800 of FIG. 8A along cut-line YY-YY. The chip 800 is now ready to be flexibly mounted on a curved surface and/or electrical connection to a flexible circuit.

FIG. 9 shows a flow chart 900 of an assembly process in accordance with an embodiment of the present invention. The process starts with the fabrication of the contoured lead frame (step 901) as, for example, described above. Then, a die is attached to the contoured lead frame (step 902). Next, the first gel layer is applied (step 903). Afterwards, a mask is applied for sputtering (step 904) and a seed layer is sputter deposited (step 905). Then the mask is removed, and copper traces are electroplated over the seed layer (step 906). Next, a second layer of gel is applied to the top of the sub-assembly (step 907). Subsequently, the bottom of the sub-assembly is removed to separate the raised features, which become the leads (step 908). Finally, a third layer of gel is applied to the newly exposed bottom of the sub-assembly (step 909) and the assembled chip is subsequently ready for use.

An embodiment of the invention has been described where interconnects are formed between bond pads and raised features by TiW sputtering followed by copper electroplating. The invention is not so limited. In some alternative embodiments, the sputtering and electroplating steps comprise sputtering with nickel (Ni), then sputtering with gold (Au), and then electroplating with gold to form gold interconnects. This alternative would, however, be more expensive since the price of gold exceeds the price of copper. In some alternative embodiments, different processes and/or materials are used to generate electrically conductive interconnects between contact points on the die and corresponding raised features of the contoured lead frame.

Embodiments of the invention have been described where individual sub-assemblies are processed. It should be noted, however, that the invention is not so limited. In alternative implementations, one- or two-dimensional arrays of attached contoured lead frames are processed together in some or all of the steps described. The attached lead frames may be singulated following the curing of the bottom gel, or at an earlier intermediary step.

Embodiments of the invention have been described where the raised features are substantially box-like. The invention, however, is not so limited. In alternative embodiments, the raised features may have other shapes, which may be prismatic or non-prismatic. In addition, it should be noted that all of the raised features of a lead frame do not need to be uniform in shape or size. In other words, a single lead frame may comprise a set of raised features where some are of different shape than others. In fact, each raised feature may be a unique shape different from all of the other raised features of the lead frame.

Embodiments of the invention have been described where a low-modulus gel is used for encapsulation. In some alternative embodiments, a different encapsulant, which is not a low-modulus gel, is used. For example, some alternative embodiments use a non-gel encapsulant that forms a cohesive flexible structure after curing.

Embodiments of the invention have been described where the same encapsulant is used in different stages of the processing and in corresponding different locations in the finished chip. In some alternative embodiments, the composition of an encapsulant used in any step—and corresponding locations—is independent of the composition of the encapsulants used in the other steps—and corresponding other locations. In other words, each step—and corresponding location—may use a unique and different encapsulant composition.

It will be further understood that various changes in the details, materials, and arrangements of the parts which have been described and illustrated in order to explain the nature of this invention may be made by those skilled in the art without departing from the scope of the invention as expressed in the following claims.

A lead frame is a collection of metal leads and possibly other elements (e.g., die paddles, power bars) that is used in semiconductor packaging for assembling a single packaged semiconductor device. Prior to assembly into a packaged device, a lead frame may have support structures (e.g., a rectangular metal frame or a base plate) that keep those elements in place. During the assembly process, the support structures may be removed. As used herein, the term "lead frame" may be used to refer to the collection of elements before assembly or after assembly, regardless of the presence or absence of those support structures.

Reference herein to "one embodiment" or "an embodiment" means that a particular feature, structure, or characteristic described in connection with the embodiment can be included in at least one embodiment of the invention. The appearances of the phrase "in one embodiment" in various places in the specification are not necessarily all referring to the same embodiment, nor are separate or alternative embodiments necessarily mutually exclusive of other embodiments. The same applies to the term "implementation."

Unless explicitly stated otherwise, each numerical value and range should be interpreted as being approximate as if the word "about" or "approximately" preceded the value of the value or range. As used in this application, unless otherwise explicitly indicated, the term "connected" is intended to cover both direct and indirect connections between elements.

The use of figure numbers and/or figure reference labels in the claims is intended to identify one or more possible embodiments of the claimed subject matter in order to facilitate the interpretation of the claims. Such use is not to be construed as limiting the scope of those claims to the embodiments shown in the corresponding figures.

The embodiments covered by the claims in this application are limited to embodiments that (1) are enabled by this specification and (2) correspond to statutory subject matter. Non-enabled embodiments and embodiments that correspond to non-statutory subject matter are explicitly disclaimed even if they fall within the scope of the claims.

In this specification including any claims, the term "each" may be used to refer to one or more specified characteristics of a plurality of previously recited elements or steps. When used with the open-ended term "comprising," the recitation of the term "each" does not exclude additional, unrecited elements or steps. Thus, it will be understood that an apparatus may have additional, unrecited elements and a method may have additional, unrecited steps, where the additional, unrecited elements or steps do not have the one or more specified characteristics.

Although the steps in the following method claims are recited in a particular sequence with corresponding labeling, unless the claim recitations otherwise imply a particular sequence for implementing some or all of those steps, those steps are not necessarily intended to be limited to being implemented in that particular sequence.

The invention claimed is:

1. A method assembling a packaged integrated circuit (IC) device, the method comprising:
    (a) forming a sub-assembly by attaching an IC die comprising a plurality of contact points to a contoured lead frame, the lead frame comprising a base plate and a plurality of raised features;
    (b) applying a first encapsulant on the top of the sub-assembly of step (a);
    (c) forming conductive interconnects between the plurality of contact points and corresponding raised features of the plurality of raised features;
    (d) applying a second encapsulant on top of the sub-assembly of step (c);
    (e) removing the bottom of the sub-assembly of step (d), including the base plate, to separate the raised features; and
    (f) applying a third encapsulant on the bottom of the sub-assembly of step (e),
    wherein the first, second and third encapsulants comprise a low-modulus gel and after curing, the low-modulus gel has a tensile modulus below 100MPa.

2. The method of claim 1, wherein:
    each of the raised features is substantially a rectangular prism;
    the raised features form a crenellated structure around the edges of the lead frame, where the raised features are separated by rectangular gaps; and
    after step (e), each separated raised feature forms a lead of the IC device.

3. The method of claim 2, wherein, after step (f), each lead comprises a proximal encapsulated portion and a distal exposed portion.

4. The method of claim 1, wherein, after step (f), the IC device is sufficiently thin to be mounted on a curved surface.

5. The method of claim 1, further comprising:
    mounting the IC device on a curved surface such that the IC device bends to conform with the curved surface.

6. The method of claim 1, wherein:
    the base plate comprises a flat central die pad area;
    the thickness of the lead frame through the die pad area is 40-60 µm; and
    the thickness of the lead frame through the raised features is 90-270 µm.

7. The method of claim 6, wherein:
    the lead frame comprises copper; and
    the lead frame is formed by half-etching.

8. The method of claim 1, wherein:
    the thickness of the IC die is 40-230 µm; and
    after step (a), the top of the IC die is substantially level with the tops of the raised features.

9. The method of claim 1, wherein step (b) comprises applying the first encapsulant so that:
    the plurality of the contact points are left exposed;
    at least a portion of the top of each of the raised features is left exposed; and
    the first encapsulant extends to a medial portion of each of the raised features.

10. The method of claim 9, wherein the height of the first encapsulant is within 25% of the height of the IC die.

11. The method of claim 1, wherein step (c) comprises:
    applying a mask to the top of the sub-assembly, wherein the mask has openings corresponding to the conductive interconnects;
    forming seed paths corresponding to the conductive interconnects using a first metallic material;
    removing the mask; and
    forming the conductive interconnects using a second metallic material.

12. The method of claim 11, wherein:
    the seed paths are formed by sputtering with the first metallic material; and
    the conductive interconnects are formed by electroplating with the second metallic material.

13. The method of claim 11, wherein:
    the first metallic material is a titanium tungsten alloy; and
    the second metallic material is copper.

14. The method of claim 13, wherein the thickness of the copper conductive interconnects is about 10-50 µm.

15. The method of claim 11, wherein:
    the first metallic material is nickel and gold; and
    the second conductive material is gold.

16. The method of claim 1, wherein:
    step (e) comprises mechanical grinding of the bottom of the sub-assembly; and
    the grinding also removes a portion of the bottom of the IC die.

17. The method of claim 1, wherein at least one of the first, second and third encapsulants is different from at least one of the other encapsulants.

18. The method of claim 1, wherein:
    the lead frame is part of an array of attached contoured lead frames;
    the method further comprises also performing steps (a)-(f) on the other lead frames of the array; and
    the method further comprises singulating the lead frames of the array.

* * * * *